United States Patent [19]

Kurkoski

[11] Patent Number: 5,706,003
[45] Date of Patent: Jan. 6, 1998

[54] APPARATUS AND METHOD FOR CANCELLATION OF OFFSET IN GAMMA SPECTRUM DATA

[75] Inventor: Philip L. Kurkoski, Houston, Tex.

[73] Assignee: Schlumberger Technology Corporation, Sugar Land, Tex.

[21] Appl. No.: 518,056

[22] Filed: Aug. 22, 1995

[51] Int. Cl.$^6$ ............................................. H03M 1/10
[52] U.S. Cl. ............................................. 341/118
[58] Field of Search ................................. 341/118, 120

[56] References Cited

U.S. PATENT DOCUMENTS 4,481,597  11/1984  Robbins ................................. 341/118
4,590,458  5/1986  Evans et al. ............................ 341/118
4,602,374  7/1986  Nakamura et al. ................... 341/118
4,860,010  8/1989  Iwamatsu ............................. 341/118

*Primary Examiner*—Howard L. Williams
*Attorney, Agent, or Firm*—Gary L. Bush; Wayne I. Kanak

[57] ABSTRACT

A method and apparatus is disclosed for removing offsets and temperature induced offset drifts of electronic devices of gamma ray spectroscopy apparatus. A flash ADC circuit is used to digitize output signals from a detector assembly. The bit stream of the least significant bit lead of the ADC circuit is first integrated to produce a D.C. level proportional to the duty cycle of the bit stream appearing on such bit lead. Such D.C. level is fed back to be summed with the D.C. level of the output lead from the detector assembly, thereby canceling offset voltages from the detector assembly and associated amplifiers.

2 Claims, 6 Drawing Sheets

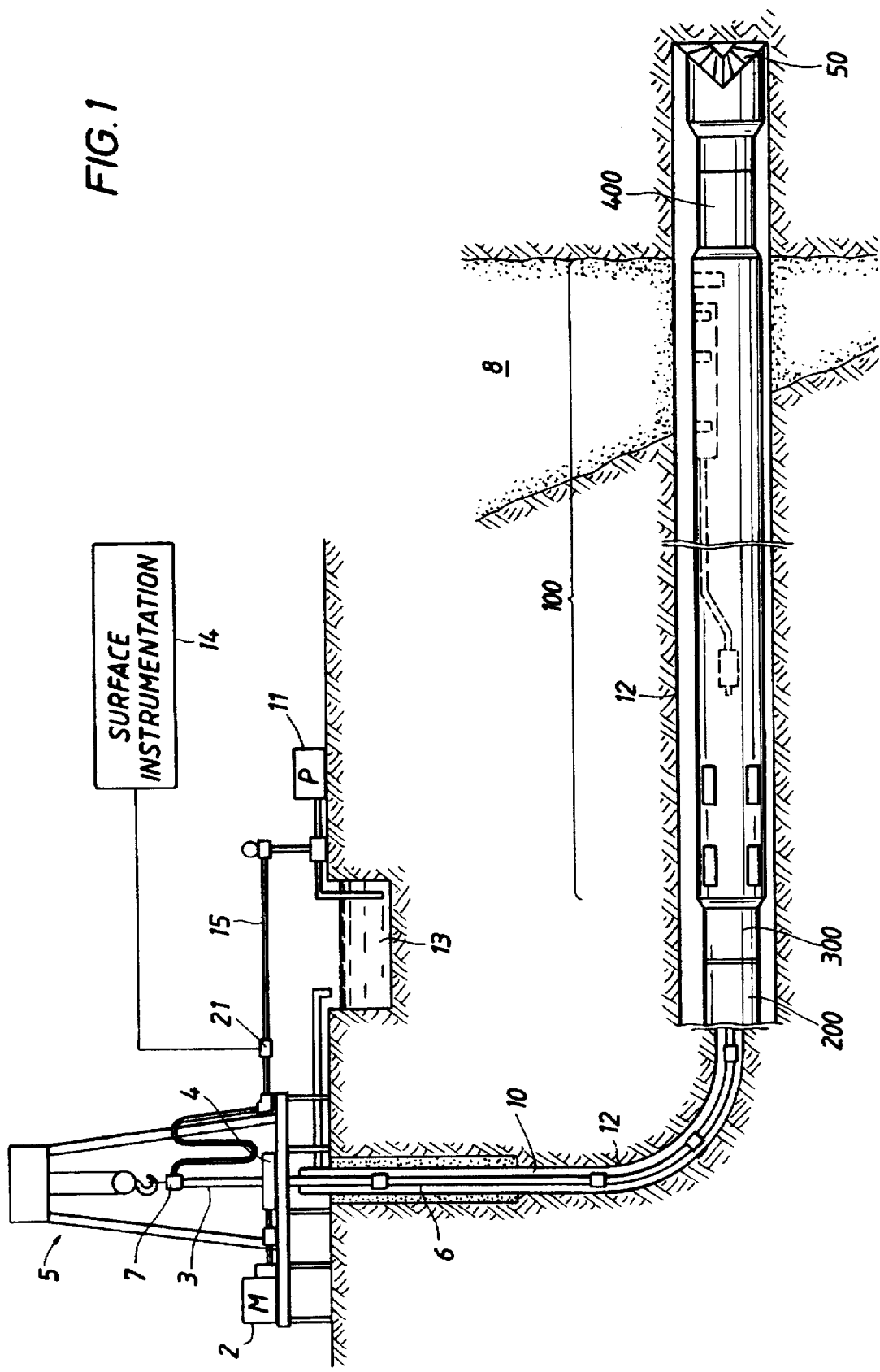

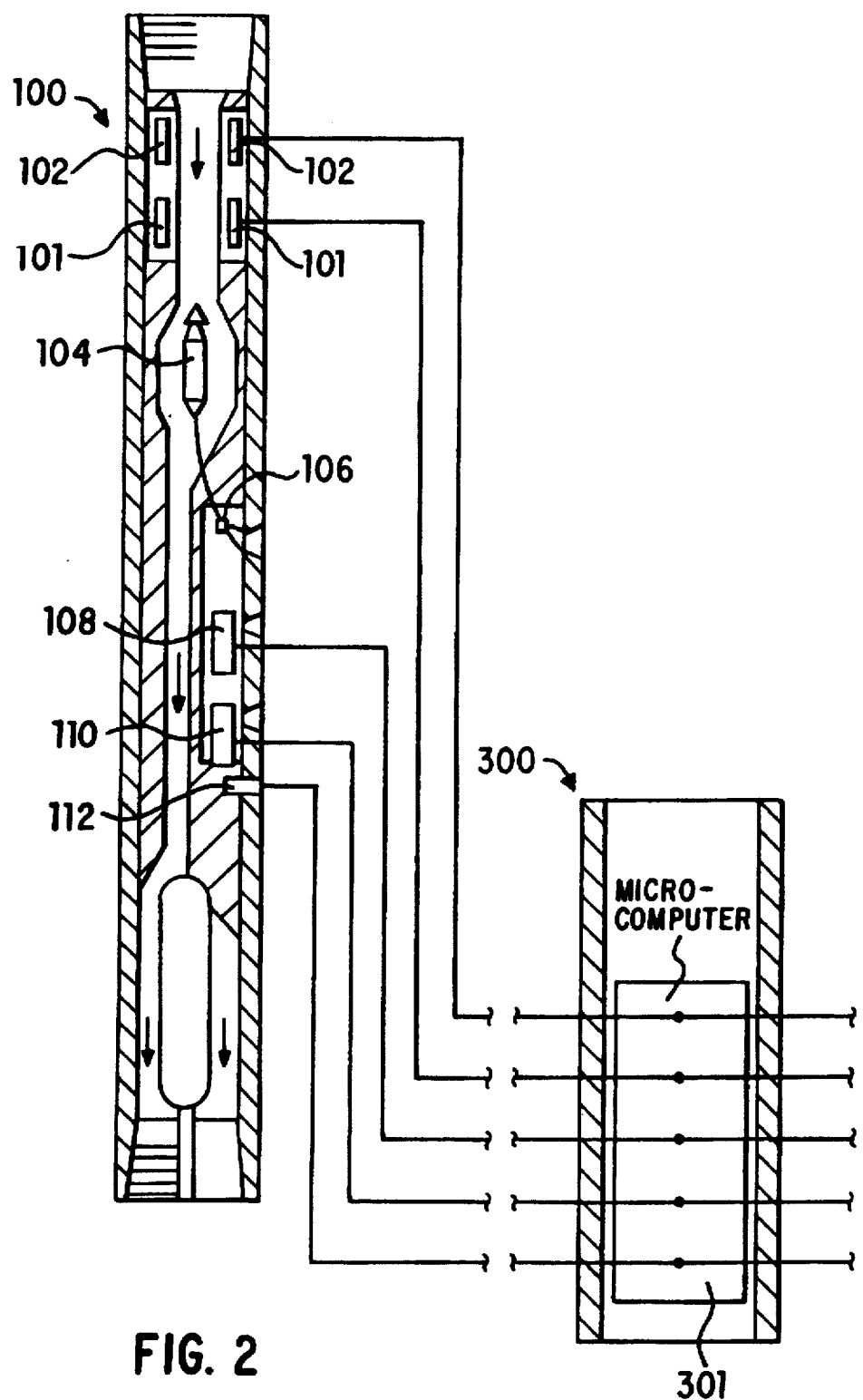

5,706,003

APPARATUS AND METHOD FOR CANCELLATION OF OFFSET IN GAMMA SPECTRUM DATA

BACKGROUND OF THE INVENTION

1. Field of the Invention

This invention relates generally to gamma ray spectroscopic apparatus for borehole logging. In particular the invention relates to apparatus and methods for cancellation of offset and offset drift in gamma spectrum data without the use of chemical sources.

2. Description of the Prior Art

Gamma ray sensing instruments including a sodium iodide (NaI) crystal in combination with a photomultiplier tube (PMT) have been used for many years as a detector to sense and count the number of gamma rays striking a measurement tool in a borehole. Such instruments have been used with great success with logging tools to measure the extent of natural radioactivity of earth formations which surround the borehole and in tools for gamma-gamma density logging of boreholes. Furthermore, gamma ray detectors are used in gamma ray spectroscopy logging apparatus either with wireline equipment or with logging-while-drilling apparatus.

A radioactive source such as Cs 137 is provided in an open-hole sonde or a logging-while-drilling tool. The source emits gamma rays into earth formations surrounding the borehole. At least one, but preferably two or more detectors rigidly attached to the sonde or tool are placed a distance apart in the borehole. Some of the gamma rays from the source enter the formation and are Compton-scattered. Some of these scattered gamma rays return to the detector. They are called back scattered gamma rays, because the source and detectors lie on the same side of the scattering portion of the earth formations; the gamma rays are scattered through more than 180°.

The gamma rays which return to the detectors are characterized by a wide spectrum of energy levels. Density logging uses the energy region above 300 KeV, where Compton scattering predominates. Formation density is related to formation porosity. Selective gamma-gamma logging uses the lower energy part of the spectrum, where photoelectric effect predominates to infer the formation's average atomic number and thereby learn something about its elemental composition and lithology.

Modern spectroscopy apparatus for gamma-gamma equipment provides a multi-channel pulse height analyzer to count the number of back-scattered gamma rays having particular energies. The multi-channel pulse height analyzer is based on digitization of the amplitudes of the pulses received from a gamma ray detector (comprising, as indicated above, a NaI crystal scintillator and a photomultiplier tube). The analyzer may include a ladder of discrete comparators, or a flash Analog to Digital Converter (ADC) which divides the spectrum into discrete pulse height regions or channels.

There is no simple way to set up a correspondence between pulse height and energy, because the entire system, from the scintillator and the PMT, through the cable, amplifiers, and digitizer, affects the pulse height. The user may provide two or three radioactive sources of known energy near the detector and adjust the gain and offset of the various parts of the system until the peaks from those sources lie in the desired channels. For example, if the maximum energy were 10 MeV, and 1024 channels were provided, one would choose 10.24 MeV and assign 10 KeV per channel; channel 410 would then correspond to an energy band between 4.095 and 4.105 MeV. When a pulse of a given energy arrives, a unit is added to the total count in the channel corresponding to its assigned energy. At the end of a counting run, each channel contains a number of counts or units corresponding to the number of pulses with that energy. Fewer channels or windows may be provided, e.g., 64 or 32. The number of counts in each channel may be displayed on a screen with the channel number (or pulse height or energy) on the abscissa and counts per channel on the ordinate. FIG. 4B of this specification, discussed in more detail below, includes an example display from such a pulse height analysis.

Because the amplitude of the pulse from the scintillator and its associated electronics changes with temperature and photomultiplier voltage, chemical calibration sources have been provided to remove offset and offset drift and gain drift errors from the measured gamma ray spectrum in order to maintain reasonable accuracy in the measurement of formation density and lithology. Chemical radioactive sources (called spectrum stabilization sources) have been provided with prior gamma-gamma spectroscopy apparatus which produce two or more peaks on the gamma ray spectrum of interest. Such sources, disposed on the logging tool, provide gamma ray peaks of a known height which are then used to control gain and offset for the gamma ray spectrum. Such gamma rays are continuously present on the tool while logging. In low count rate conditions, such as logging-while-drilling applications, stabilization sources with energies low enough to determine an offset correction (such as Am 241@60 KeV) are also detrimental to the accuracy of the measurement, because the low energy stabilization source count rate masks a portion of the formation signal.

A primary object of this invention is to provide electronic apparatus, without any chemical radioactive source, for a logging tool for correction of offset and offset drift errors in gamma ray measurements.

Another object of this invention is to provide a method for offset and offset drift correction in the detection of scattered gamma rays of a borehole logging tool of improved accuracy compared to prior methods which use a chemical source for calibration for low energy stabilization count rate.

SUMMARY OF THE INVENTION

A flash ADC, used to digitize the gamma ray spectrum of scattered gamma rays returning to a logging tool or sonde, is used not only to classify the gamma rays as to their energy levels but also simultaneously to provide a lower calibration point (0 KeV), thereby eliminating the need for a low energy stabilization source on the gamma-gamma tool. The lowest bit of the flash ADC is used to hold the baseline signal applied to the input of the ADC at a known voltage, thereby canceling all offset and offset drift sources.

BRIEF DESCRIPTION OF THE DRAWINGS

The objects, advantages and features of the invention will become more apparent by reference to the drawings which are appended hereto and wherein like numerals indicate like elements and wherein an illustrative embodiment of the invention is shown, of which:

FIG. 1 is an illustration of a logging-while-drilling system including gamma-gamma spectroscopy apparatus within which the invention is incorporated;

FIG. 2 illustrates a gamma ray source and gamma ray detector system of a logging-while-drilling tool in which the invention is incorporated;

3

Figure 4A:
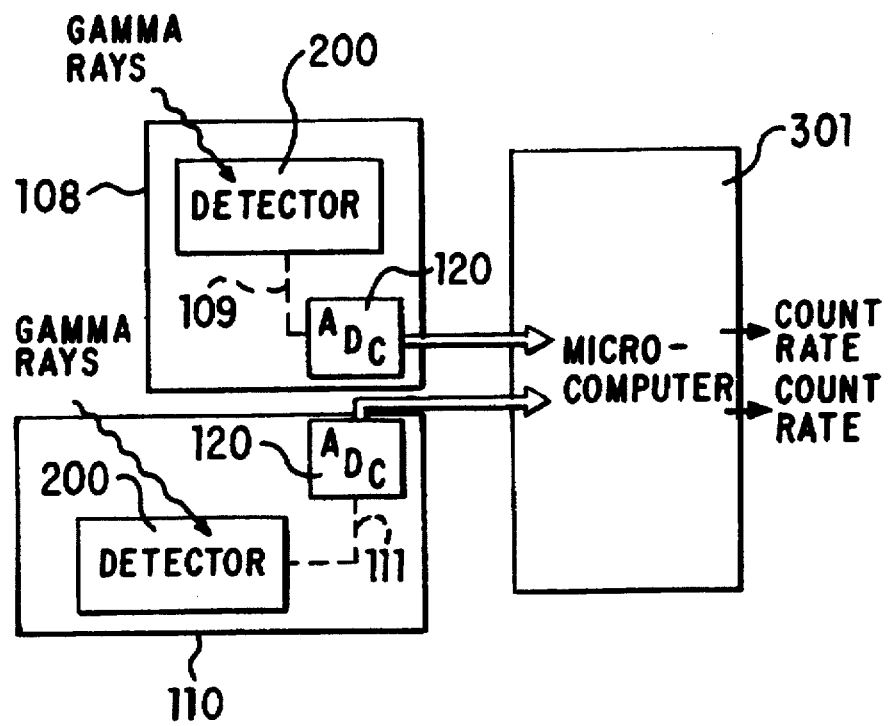
Figure 4B:
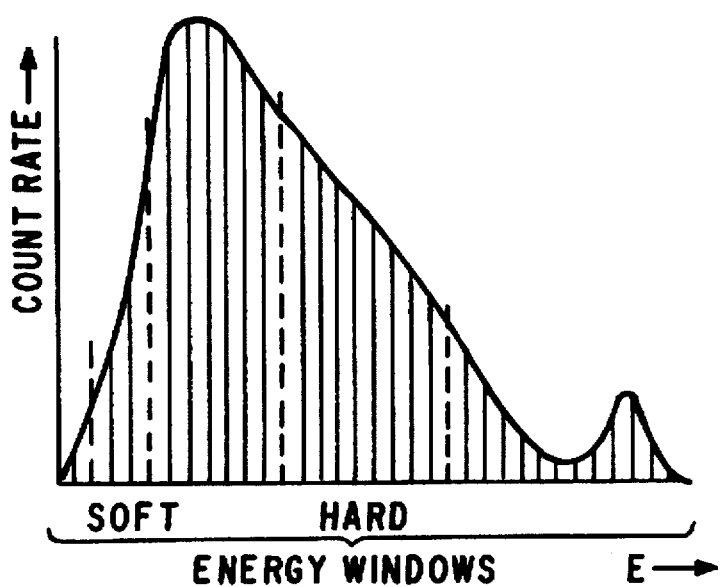
Figure 5:
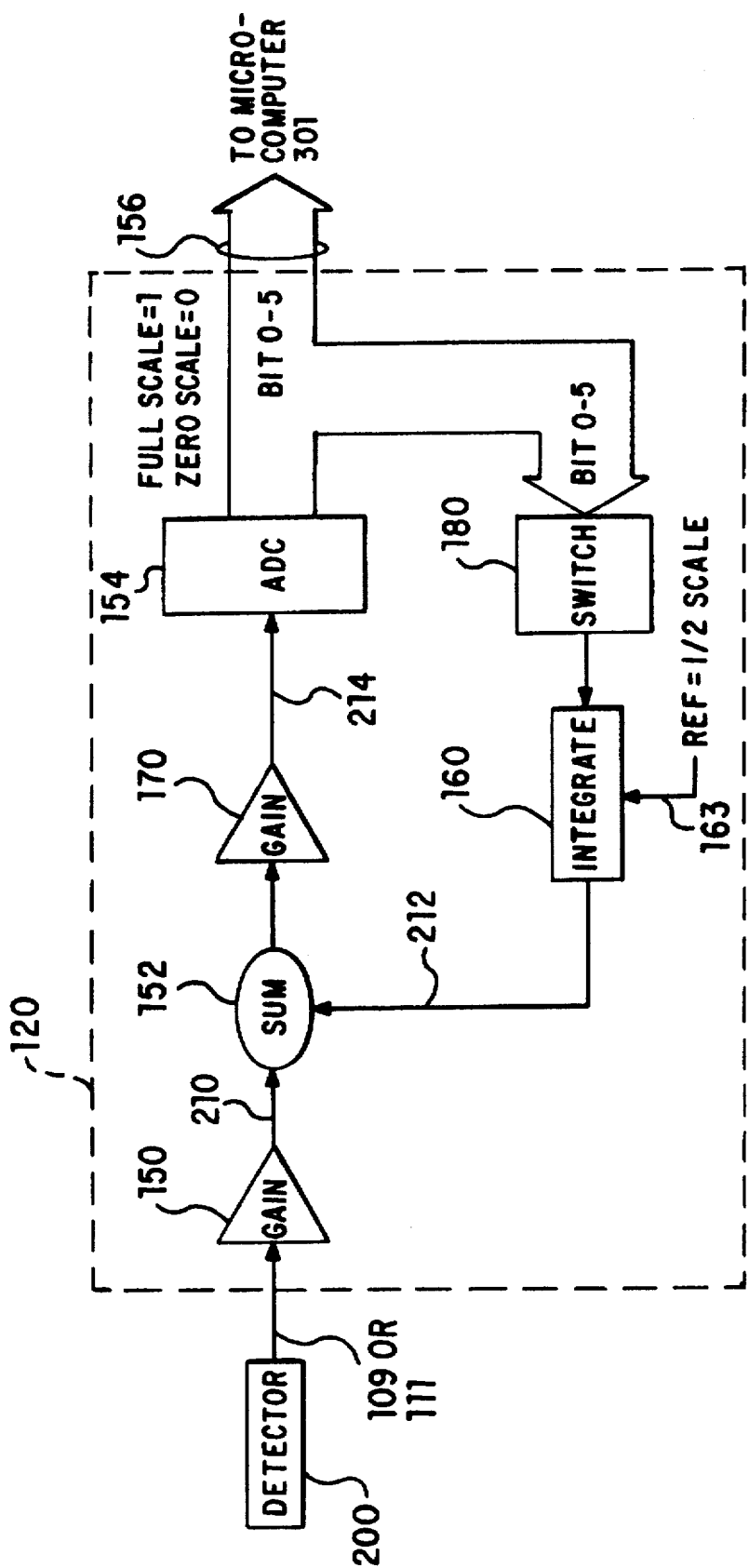
Figure 6:
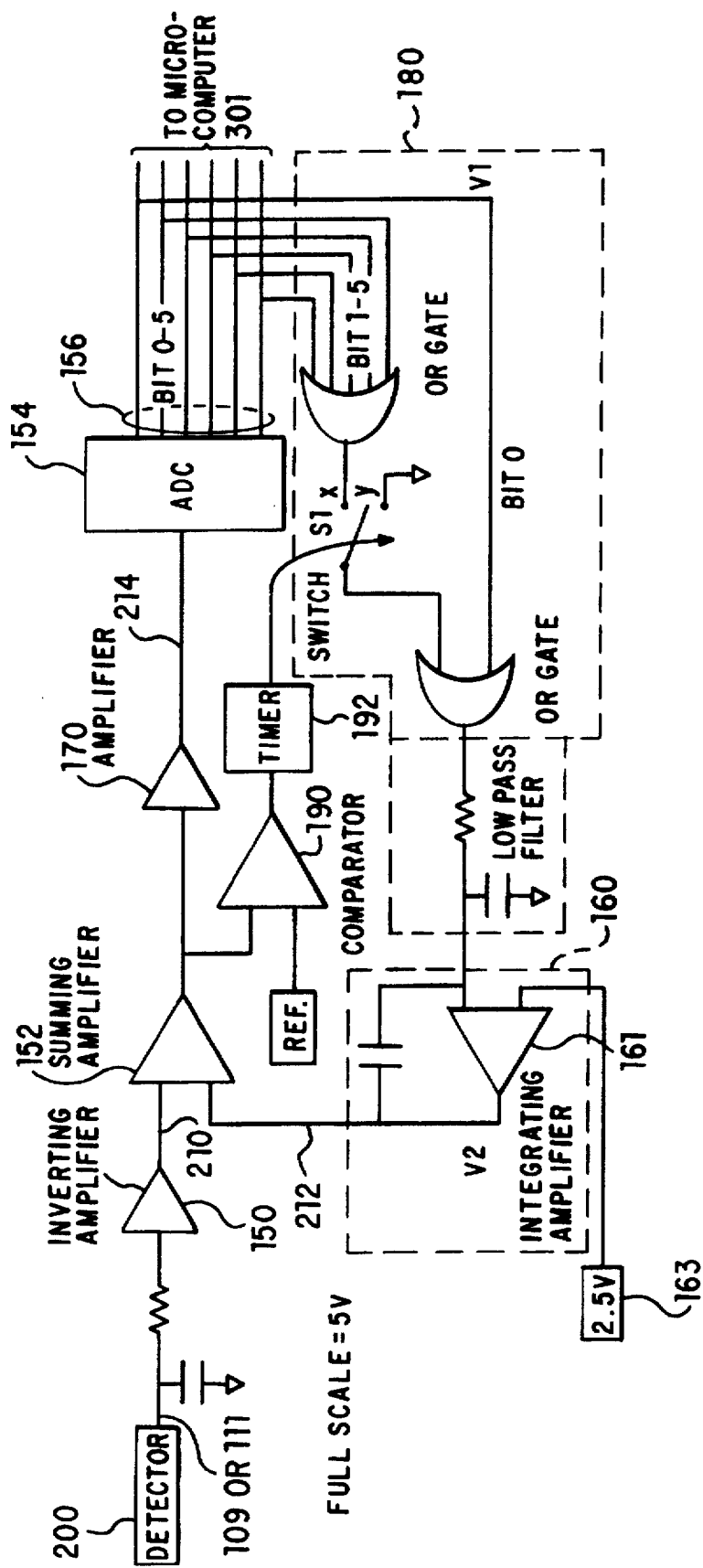
Figure 7:
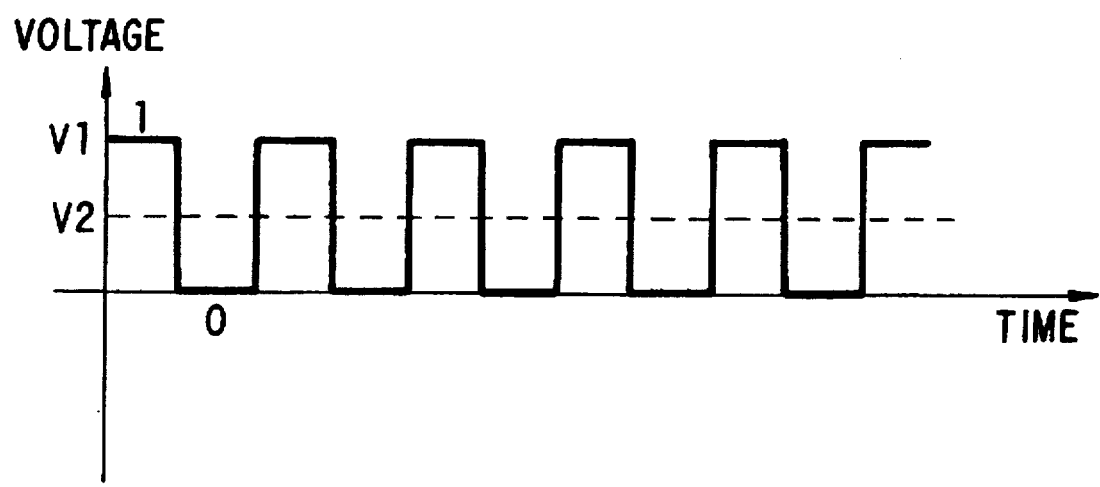

FIG. 3 illustrates a downhole microcomputer which receives count rate signals from the detector systems of FIG. 2;

FIGS. 4A and 4B illustrate the detector systems of FIG. 2 while showing ADC's modified according to the invention and illustrating a graph of count rate versus energy windows produced by the gamma-gamma ray spectroscopy apparatus;

FIG. 5 is a block diagram illustrating a feedback system according to the invention for removing offsets and temperature induced offset drifts of the electronic devices of the detection system;

FIG. 6 illustrates in more detail the circuit elements of the arrangement of FIG. 5; and FIG. 7 is a waveform showing the duty cycle of the least significant output bit of a flash ADC circuit.

DESCRIPTION OF THE PREFERRED EMBODIMENT

The preferred embodiment of the invention described specifically below is in a system like that of a logging-while-drilling system for measuring formation characteristics as a function of angular position within a borehole. Such system is described in pending U.S. patent application Ser. No. 08/183,089 which is assigned to the same assignee as is this application. Such application is incorporated by reference herein.

Although the preferred application of the invention described below is in a logging-while-drilling system in general, and specifically like that of U.S. Ser. No. 08/183, 089, the invention may find application in any gamma ray detection system, whether a system designed for logging-while-drilling applications or for open hole wireline operations. It may even find application in natural gamma ray logging apparatus.

FIG. 1 illustrates a preferred embodiment in which the invention is incorporated. A logging-while-drilling (LWD) tool 100 is connected in tandem with a drilling assembly including drill bit 50. An associated downhole electronics module 300 and measuring-while-drilling (MWD) tool 200 including magnetometers and accelerometers are also connected in tandem with LWD tool 100. Module 300 may be a separate "sub" or it may be disposed in the body of LWD tool 100. A communication sub 400 is also provided as illustrated in the drilling assembly.

The LWD tool 100 is shown for illustration purposes as being in an inclined portion of a borehole at the end of a drill string 6 which turns in a borehole 12 which is formed in formation 8 by penetration of bit 50. Of course, the drilling assembly may also be in the vertical portion of the borehole. A drilling rig 5 turns drill string 6. Drilling rig 5 includes a motor 2 which turns a kelly 3 by means of a rotary table 4. The drill string 6 includes sections of drill pipe connected end-to-end to the kelly 3 and turned thereby. The MWD tool 200, electronics module 300 and the LWD tool 100 and communication sub 400 are all connected in tandem with drill string 6. Such subs and tools form a bottom hole drilling assembly between the drill string 6 of drill pipe and the drill bit 50.

As the drill string 6 and the bottom hole assembly turn, the drill bit 50 forms the borehole 12 through earth formations 8. Drilling fluid or "mud" is forced by pump 11 from mud pit 13 via stand pipe 15 and revolving injector head 7 through the hollow center of kelly 3 and drill string 6, and the bottom hole drilling assembly to the bit 50. Such mud acts to lubricate drill bit 50 and to carry borehole cuttings or chips upwardly to the surface via annulus 10. The mud is returned to mud pit 13 where it is separated from borehole cuttings and the like, degassed, and returned for application again to the drill string 6.

The communication sub 400 receives output signals from sensors of the LWD tool 100 and from computers in the downhole electronics module 300 and MWD tool 200. Such communications sub 400 is designed to transmit coded acoustic signals representative of such output signals to the surface through the mud path in the drill string 6 and bottom hole drilling assembly. Such acoustic signals are sensed by transducer 21 in standpipe 15, where such acoustic signals are detected in surface instrumentation 14. The communication sub 400, including the surface instrumentation necessary to communicate with it, are arranged as the downhole and surface apparatus disclosed in U.S. Pat. No. 4,479,564 and U.S. Pat. No. 4,637,479, which patents are incorporated herein by reference.

The communication sub 400 may advantageously include the communication apparatus disclosed in U.S. Pat. No. 5,237,540. Such patent is assigned to the assignee of this application and is incorporated herein by reference.

FIG. 2 illustrates in a schematic way the LWD tool 100 of FIG. 1. The physical structure of the LWD tool body and associated sensors is substantially like that described in U.S. Pat. No. 4,879,463 to Wraight, et al., and U.S. Pat. No. 5,017,778 to Wraight. Both of such patents are assigned to the assignee of the invention described herein. Such patents are incorporated herein for this description of a logging-while-drilling tool, specifically a compensated density neutron tool used in logging-while-drilling measurements of formation characteristics. Stabilizer blades may be provided as an alternative embodiment of the LWD tool 100, where a stabilized tool is required.

The LWD tool 100 includes a source of neutrons 104 disposed axially, and near and far spaced neutron detectors 101, 102. It also includes a source of gamma rays 106 and short and long spaced gamma ray detector assemblies 108, 110. The preferred LWD tool 100 also includes an ultrasonic transducer 112 for measuring tool standoff from the borehole wall. Such ultrasonic transducer and system is described in U.S. Pat. No. 5,130,950 in the name of Orban, et al., and is also assigned to the assignee of the invention described herein. Such patent is also incorporated by reference for its detailed description of an ultrasonic transducer 112 of the LWD tool 100.

The electronics module 300 of FIG. 3, at the option of a designer, may be part of MWD tool 200 or it may be an independent sub. In the preferred system as described above, it includes a magnetometer section, but more importantly to the invention described herein, it includes a microcomputer 301 for accepting signals from gamma ray detector assemblies 108, 110. Such gamma ray count rate signals are combined with other signals from magnetometers, accelerometers and ultrasonic detectors to generate borehole characteristics such as density and lithology, as a function of angular distance about the borehole and as a function of depth in the borehole. The signals received in microcomputer 301 thus are applied to computer programs stored in memory. Such programs need not be described here but are described in detail in the above mentioned pending U.S. patent application Ser. No. 08/183,089.

FIG. 4A is a schematic representation of gamma ray detection assemblies 108, 110. Such assemblies include conventional detectors 200 which include a NaI scintillation crystal/photoelectric tube assembly. The pulse signals of the photoelectric tubes are applied on respective leads 109, 111 to analog to digital (ADC) circuit assemblies 120 as illustrated in more detail in FIGS. 5 and 6. The ADC assemblies 120 (each assembly being identical in construction to the other) digitize the heights of pulses received from detectors 200. Such ADC assemblies in combination with microcomputer 301 accumulate the number of pulses per unit time (i.e., count rate) having a predetermined range of pulse amplitude or "height". Because the range of height of a pulse signal is proportional to the energy of a returning gamma ray which strikes the NaI scintillator crystal, such range of height is referred to as the energy interval or window. FIG. 4A illustrates that the pulses accumulated in the energy windows are digitized and applied to microcomputer 301. FIG. 4B depicts an illustrative graph of energy windows along the abscissa and count rate along the ordinate of the graph. Low energy windows are known as "soft" windows. Higher energy windows are known as "hard" windows.

FIG. 5 is a block diagram of ADC assembly 120 according to the invention, which is designed and arranged to accept pulse signals from detector 200. The pulse signal from lead 109 or 111 is applied to amplifier 150 in order to boost the signal amplitude into a reasonable working voltage. Next, the amplified signal on lead 210 is summed with a D.C. signal on lead 212 from the output of integrator 160. An additional gain is provided by amplifier 170 in order to bring the voltage of the summed signal into the range of ADC 154. Quantization of the analog signal is made by ADC 154. For illustration, consider ADC 154 as a 6-bit ADC. (The ADC for the preferred embodiment of the apparatus of this invention is a 6-bit ADC.) The ADC output bits 156 are read by computer 301 to determine the pulse height for each pulse and to accumulate a spectrum of pulse heights from which the formation density is calculated.

In order to maintain a constant offset baseline, the ADC output bits 156 are fed back to switch 180. Switch 180 controls the signal fed to integrator 160 as shown in FIG. 6. FIG. 6 illustrates a preferred embodiment of the block diagram depicted in FIG. 5.

When no pulse is present on lead 109 or 111, switch S1 of FIG. 6 is at position x such that all the ADC output bits 156 are applied to integrating amplifier 161 (of integrator 160) via two OR gates. The output of switch 180 oscillates between 1 and 0 when the input to switch 180 oscillates between 000001 and 000000. The output of switch 180 is applied to integrator 160 which adjusts the D.C. input to summer 152 until the duty cycle of the switch 180 equals the reference value 163 applied to integrator 160. The reference voltage 163 is set to be ½ full scale voltage (full scale voltage is 1; zero scale voltage is 0); the duty cycle of the output of switch 180, which is required to equal ½ full scale, is 50%. The output of integrator 160 remains constant so long as the duty cycle of the pulse train from ADC output 156 remains at 50%. If the offset voltage on leads 109 or 111 after amplification on lead 210 changes, the integrator 160 adjusts its D.C. output level to restore a 50% duty cycle output on ADC 154.

When a pulse is present on lead 109 or 111, switch S1 is at position y such that the least significant output bit of ADC 154 is passed directly to the input of integrating amplifier 161. The output of switch 180 oscillates between xxxxx1 and xxxxx0 (where x is indeterminate). Such oscillation causes the baseline to hold steady during the time when a pulse is present. Once the pulse has passed or a timeout is reached, switch S1 reverts back to its normal no-pulse position x. Timeouts are provided to prevent the system from locking onto false baselines, when there are 64 possible stable conditions for the least significant bit to have a 50% duty cycle. The presence of a pulse can be detected by comparator 190 with a predetermined trip threshold. Once a pulse is detected, the comparator triggers timer 192 for a timeout countdown. To prevent the pulse height signal on lead 109 or 111 as amplified on lead 210 from being averaged into the baseline adjustment provided by the feedback loop, the output of integrator 160 is held constant during the signal pulse width time of a detected gamma ray.

Hence, regardless of whether a pulse is present or not, the bit 0 of ADC 154 represents the lower calibration point of the detector. This D.C. baseline of 0 KeV is maintained at exactly the lowest transition threshold of ADC 154 via this feedback loop with integrator 160.

FIG. 7 illustrates a bit stream on bit 0 lead of ADC output leads 156. The signal voltage V1 is a sequence of "1"s and "0"s. The voltage V2 at the output of integrator 160 is the integration, or D.C. level, of the voltage V1 bit stream. If the offset on lead 210 increases, the proportion of "1"s on bit 0 lead decreases, thereby reducing voltage level V2. If the offset on lead 210 decreases, the proportion of "1"s on bit 0 lead increases, thereby increasing the voltage level V2. Accordingly, the voltage V2, proportional to the duty cycle of "0"s and "1"s on bit 0 lead of ADC output leads 156, acts as a negative feedback signal for keeping the zero level of lead 214 constant.

With the improved circuitry and method as described above, no chemical sources are needed, as were required with prior systems, for offset and drift stabilization. Gain of the system must be stabilized, however. Accordingly, a chemical source (not illustrated) is placed inside the detector 200. Such source emits a gamma ray at the upper end of the dynamic range being measured. The combination of gain stabilization and offset stabilization holds the gamma ray spectrum measurement made by the tool electronics stable over the operating temperature range.

Various modifications and alterations in the described methods and apparatus will be apparent to those skilled in the art of the foregoing description which does not depart from the spirit of the invention. For this reason, such changes are desired to be included in the appended claims. The appended claims recite the only limitation to the present invention. The descriptive manner which is employed for setting forth the embodiments should be interpreted as illustrative but not limitative.

What is claimed is:

1. An improved gamma ray detection assembly including a gamma ray detector which produces pulses having pulse heights proportional to energy levels of gamma rays applied to the detector and an analog to digital circuit responsive to said pulses on an input lead from said gamma ray detector, said analog to digital circuit having a plurality of output bit leads on which "0" or "1" bits appear, said output bit leads including a bit 0 lead for the least significant bit of said output bit leads, with all of the bits appearing on such leads being representative of the pulse height of a pulse applied to said circuit, wherein the improvement comprises, a summing circuit having first and second inputs and an output, with said input lead connected to said first input of said summing circuit and with said output connected to said analog to digital circuit, an integrator circuit means having an output and an input with said output connected to said second input of said summing circuit, means for connecting all of said output bit leads to said input of said integrator circuit means when no pulse is present on said input lead, and means for connecting only the bit 0 lead from said analog to digital circuit to said input of said integrator circuit means when a pulse is present on said input lead, whereby the number of "1" bits on said bit 0 lead automatically adjusts to create a constant duty cycle and produce a constant D.C. value applied to said input lead of said analog to digital circuit so as to cancel D.C. drifts applied to said lead from said detector assembly.

2. The improved gamma ray detection assembly of claim 1 wherein said means for connecting only the bit 0 lead includes a timeout circuit which insures that only the bit 0 lead is applied to said integrator circuit means for a predetermined length of time after a pulse is present on said input lead.

\* \* \* \* \*